United States Patent
Kuo et al.

(10) Patent No.: US 12,501,628 B2
(45) Date of Patent: Dec. 16, 2025

(54) MEMORY COMPRISING CONDUCTIVE FERROELECTRIC MATERIAL IN SERIES WITH DIELECTRIC MATERIAL

(71) Applicant: Intel Corporation, Santa Clara, CA (US)

(72) Inventors: Charles Kuo, Hillsboro, OR (US); Kaan Oguz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 888 days.

(21) Appl. No.: 17/524,075

(22) Filed: Nov. 11, 2021

(65) Prior Publication Data

US 2023/0147275 A1     May 11, 2023

(51) Int. Cl.
*H10B 63/00* (2023.01)
*H10N 70/00* (2023.01)
*H10N 70/20* (2023.01)

(52) U.S. Cl.
CPC ............. *H10B 63/84* (2023.02); *H10B 63/20* (2023.02); *H10N 70/011* (2023.02); *H10N 70/25* (2023.02); *H10N 70/8828* (2023.02); *H10N 70/883* (2023.02)

(58) Field of Classification Search
CPC ...... H10B 63/84; H10B 63/20; H10N 70/011; H10N 70/25; H10N 70/8828; H10N 70/883; H10N 70/20; H10N 70/826
See application file for complete search history.

(56) References Cited

U.S. PATENT DOCUMENTS

| | | | |
|---|---|---|---|
| 10,923,500 B2* | 2/2021 | Ino | H10B 51/20 |
| 2009/0032795 A1* | 2/2009 | Kim | H10D 64/64 |
| | | | 257/E29.104 |
| 2020/0286984 A1* | 9/2020 | Chang | H10D 1/042 |
| 2021/0272983 A1* | 9/2021 | Gilbert | H10D 30/701 |
| 2021/0342679 A1* | 11/2021 | Karpov | H10N 70/826 |
| 2021/0398991 A1* | 12/2021 | Manfrini | H10D 64/689 |

OTHER PUBLICATIONS

Tominaga, J., Kolobov, A. V., Fons, P., Nakano, T., Murakami, S. (2014). Ferroelectric Order Control of the Dirac-Semimetal Phase in GeTe-Sb2Te3 Superlattices. Adv. Mater. Interfaces, 1: 1300027. doi: 10.1002/admi.201300027 (Year: 2014).*

Boschker, Jos E., et al. "GeTe: A Simple Compound Blessed with a Plethora of Properties." CrystEngComm, vol. 19, No. 36, Sep. 2017, pp. 5324-5335. pubs.rsc.org, https://doi.org/10.1039/C7CE01040K.

Fei, Zaiyao, et al. "Ferroelectric Switching of a Two-Dimensional Metal." Nature, vol. 560, No. 7718, Aug. 2018, pp. 336-347. www.nature.com, https://doi.org/10.1038/s41586-018-0336-3.

(Continued)

*Primary Examiner* — Allison Bernstein
(74) *Attorney, Agent, or Firm* — Alliance IP, LLC

(57) ABSTRACT

A memory device including a three dimensional crosspoint memory array comprising a plurality of memory cells, wherein a memory cell of the plurality of memory cells comprises a conductive ferroelectric material and wherein the conductive ferroelectric material is in series with a dielectric material.

20 Claims, 13 Drawing Sheets

(56) References Cited

OTHER PUBLICATIONS

Kowalczyk, Philippe, et al. "Impact of Stoichiometry on the Structure of van Der Waals Layered GeTe/Sb2Te3 Superlattices Used in Interfacial Phase-Change Memory (IPCM) Devices." Small, vol. 14, No. 24, May 14, 2018, p. 1704514. Wiley Online Library, https://doi.org/10.1002/smll.201704514.

Krempaský, J., et al. "Operando Imaging of All-Electric Spin Texture Manipulation in Ferroelectric and Multiferroic Rashba Semiconductors." Physical Review X, vol. 8, No. 2, Jun. 2018, p. 021067. APS, https://doi.org/10.1103/PhysRevX.8.021067.

Lomenzo, Patrick D., et al. "Ferroelectric $Hf_{1-X}Zr_xO_2$ Memories: Device Reliability and Depolarization Fields." 2019 19th Non-Volatile Memory Technology Symposium (NVMTS), Jun. 12, 2021, pp. 1-8. IEEE Xplore, https://doi.org/10.1109/NVMTS47818.2019.9043368.

Mehta, R. R., et al. "Depolarization Fields in Thin Ferroelectric Films." Journal of Applied Physics, vol. 44, No. 8, Aug. 1973, pp. 3379-3385. aip.scitation.org (Atypon), https://doi.org/10.1063/1.1662770.

Saito, Yuta et al.: "Self-organized van der Waals epitaxy of layered chalcogenide structures", Basic Solid State Physics, Phys. Status Solidi B 252, No. 10, 2151-2158 (2015) / DOI 10.1002/pssb.201552335, Aug. 15, 2015 (pp. 2151-2158).

Simpson, R. E., et al. "Interfacial Phase-Change Memory." Nature Nanotechnology, vol. 6, No. 8, Aug. 2011, pp. 501-505. www.nature.com, https://doi.org/10.1038/nnano.2011.96.

\* cited by examiner

MEMORY COMPRISING CONDUCTIVE FERROELECTRIC MATERIAL IN SERIES WITH DIELECTRIC MATERIAL

FIELD

The present disclosure relates in general to the field of computer development, and more specifically, to memory comprising conductive ferroelectric material in series with dielectric material.

BACKGROUND

A storage device may include non-volatile memory, such as multi-stack 3D crosspoint memory arrays. Memory cells of the memory arrays may be programmed via wordlines and bitlines of the memory array.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
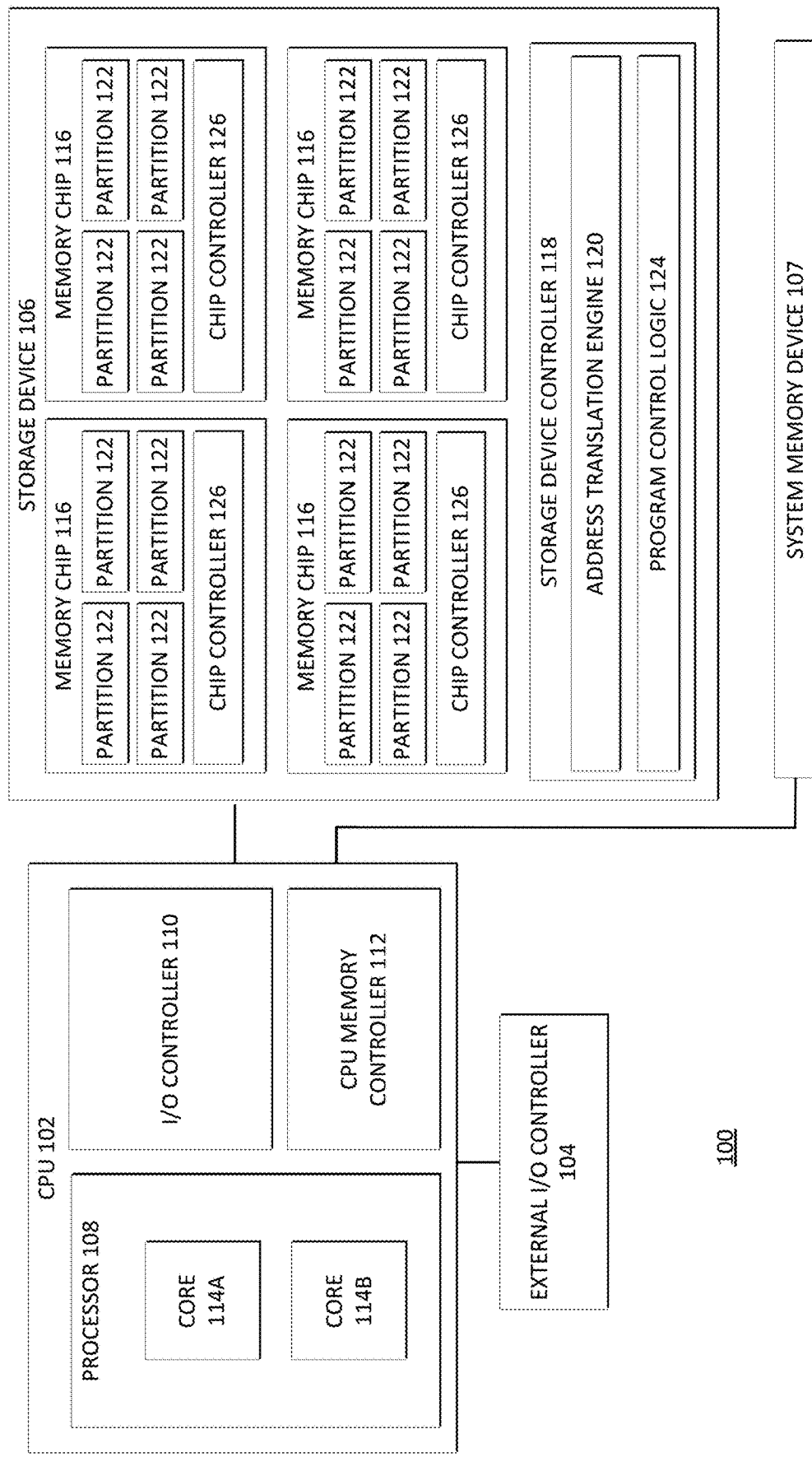
FIG. 1 illustrates components of a computer system in accordance with certain embodiments.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

Crosspoint memory offers exciting opportunities with the advent of new materials and cell architectures. Crosspoint memory generally includes a selector and a memory device. Various embodiments of the present disclosure provide a memory cell architecture comprising a conductive ferroelectric material in series with a dielectric material. A ferroelectric material may have a spontaneous electric polarization that can be reversed by the application of an external electric field. Some embodiments may also comprise a Schottky diode functioning as a selector. The memory may exhibit unipolar characteristics (e.g., the switching of the memory cell between a set state and a reset state may be controlled by a unipolar electric field) and the two dimensional (2D)-ferroelectric nature of the memory may provide the ability to introduce fast, field-driven switching into crosspoint memory technology. While a large amount of current is generally needed to generate enough heat to switch some conventional crosspoint memory cells, if an electric field is used instead to switch a memory cell, the current (and power) may be reduced (and the cycling endurance may potentially be increased due to the decreased current). Embodiments of the present disclosure may provide one or more technical advantages, such as an increase in speed, an increase in memory density, an increase in bandwidth, or a reduction in power.

The memory cells described herein may be utilized within any suitable components shown in FIGS. 1-4, such as partitions 122 of memory chips 116 or system memory device 107. The memory cells may have any suitable characteristics of memory cells described in connection with FIGS. 1-4.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
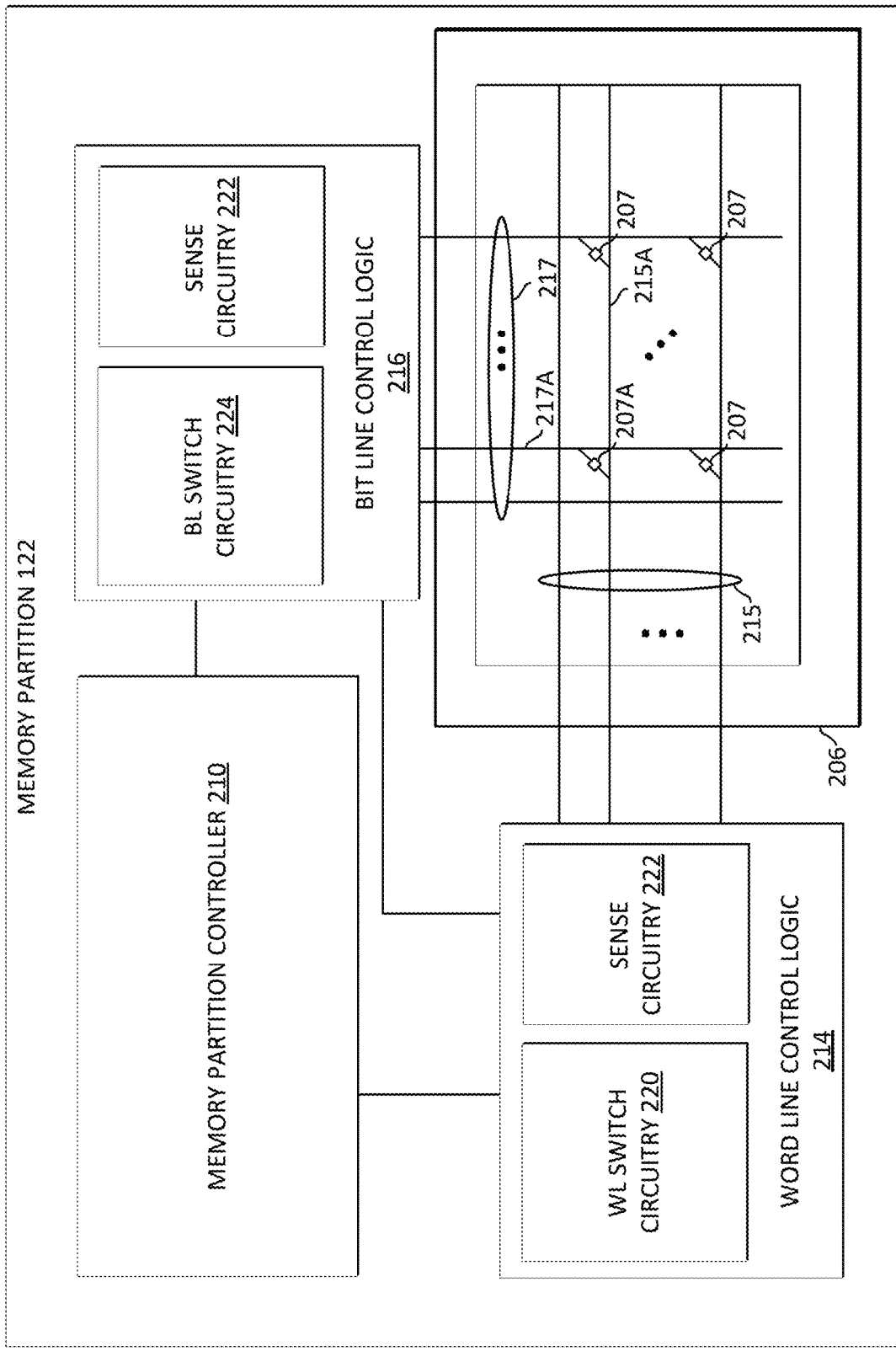
FIG. 2 illustrates a memory partition in accordance with certain embodiments.

FIG. 2 illustrates a detailed example view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A dependent on a program state of the memory cell. A comparator such as a sense amplifier may compare icell with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
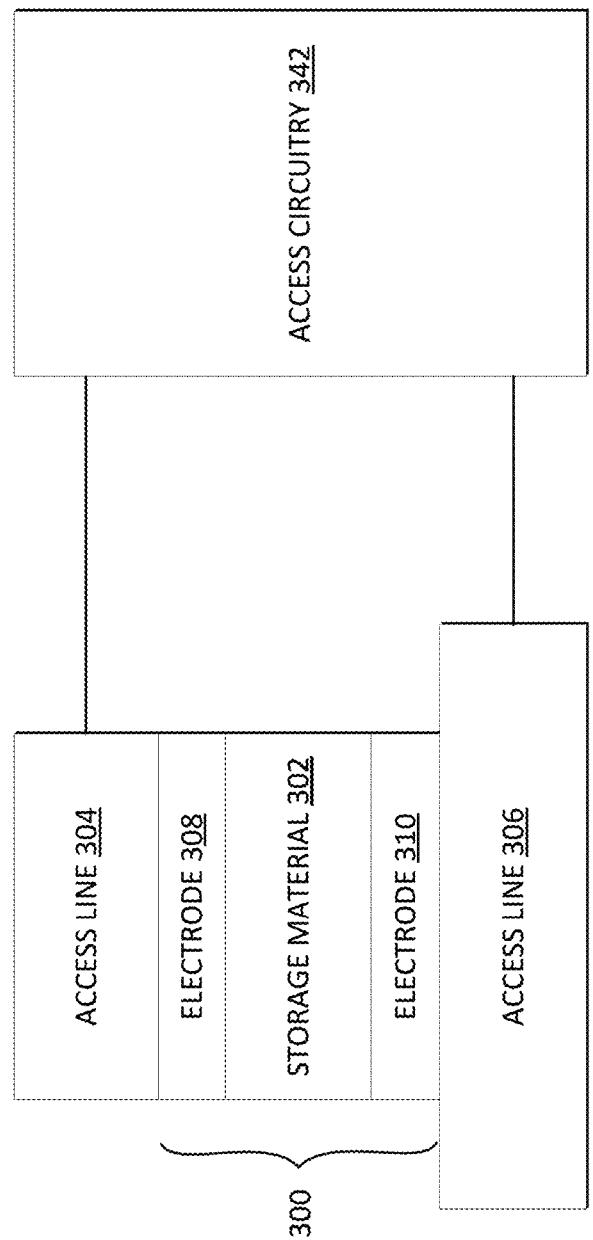
FIG. 3 illustrates a memory cell coupled to access circuitry in accordance with certain embodiments.

FIG. 3 illustrates a memory cell 300 coupled to access circuitry 342 in accordance with certain embodiments. The memory cell 300 includes a storage material 302 (e.g., a storage stack) between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In one embodiment, storage material 302 exhibits memory effects. A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage material 302 to be in a particular state. The storage material 302 can include, for example, a chalcogenide material or other material capable of functioning as both a storage element and a selector, to enable addressing a specific memory cell and determining what the state of the memory cell is. In the embodiment depicted, each memory cell 300 is a two-terminal device (i.e., the memory cell 300 has two electrodes to receive control signals sufficient to write to and read from the memory cell 300).

In some embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage material 302 may include any suitable material programmable to a plurality of states. In some embodiments, the storage material 302 may include a chalcogenide material comprising a chemical compound with at least one chalcogen ion, that is, an element from group 16 of the periodic table. For example, the storage material 302 may include one or more of: sulfur (S), selenium (Se), or tellurium (Te). Additionally or alternatively, in various embodiments, storage material 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In some examples, the storage material (such as any of the materials described above) is a phase change material. In other examples, the storage material 302 is not a phase change material, e.g., can be in one or multiple stable states (or transition between stable states) without a change in phase.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage material 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may also be equivalent to a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity to induce a programming threshold event and application of current for a duration of time, which causes the memory cell 300 to exhibit a particular threshold voltage at a subsequent reading voltage of a same or different polarity.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word.

In one embodiment, electrodes 308 are disposed between storage material 302 and access lines 304, 306. Electrodes 308 electrically couple access lines 304, 306 to storage material 302. Electrodes 308 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Other embodiments can include memory cells having additional or different layers of material than illustrated in FIG. 3 (e.g., a selection device between the access line 304 and the storage element, a thin dielectric material between the storage material and access lines, or other suitable configuration).

Figure 4:
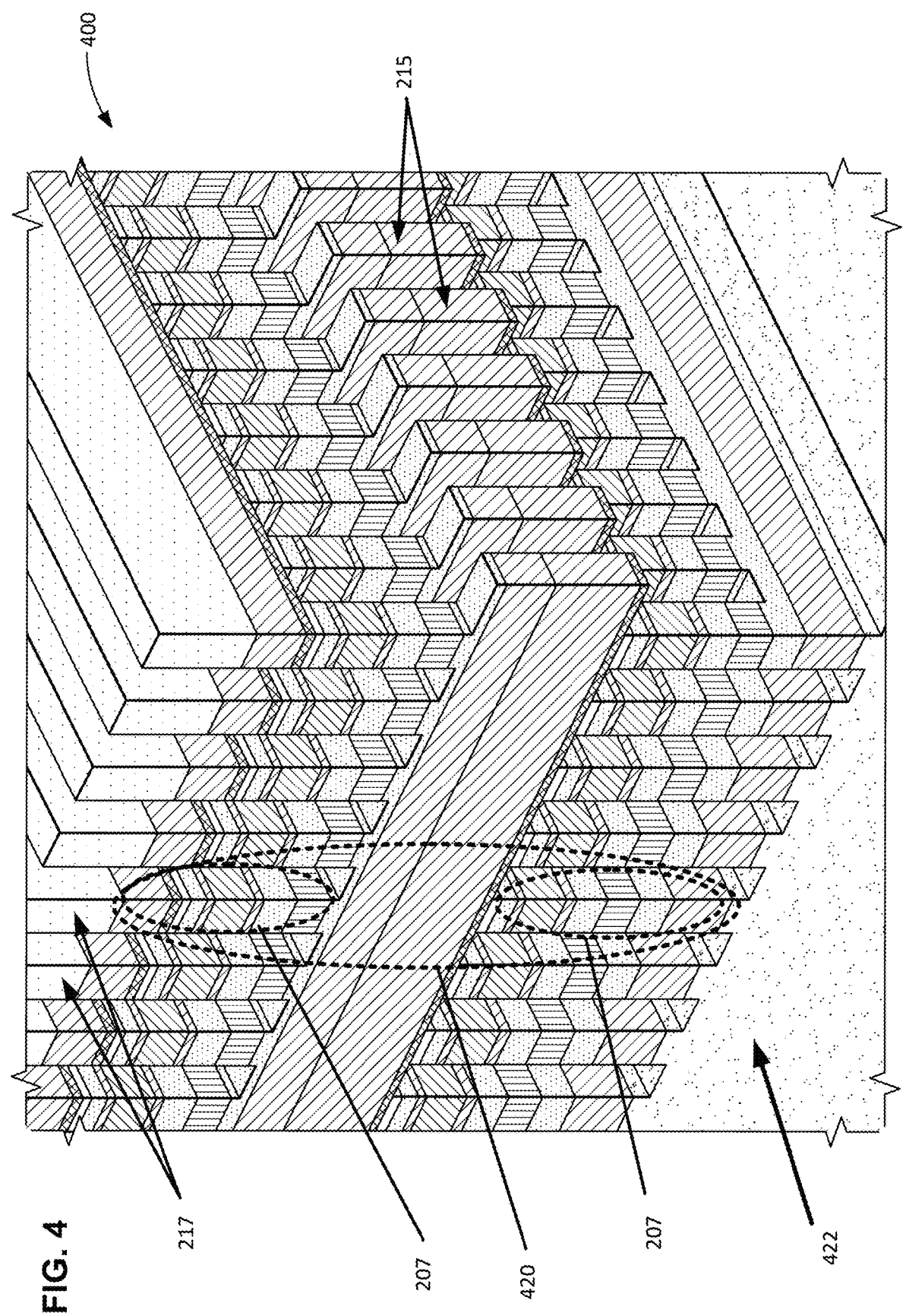
FIG. 4 is a perspective view of portions of a three dimensional (3D) crosspoint memory stack according to one embodiment.

FIG. 4 is a perspective view of portions of a 3D crosspoint memory stack according to one embodiment. The specific layers shown are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the wordlines (WLs) and bitlines (BLs) are orthogonal to each other, and traverse or cross each other in a crosshatch pattern. A crosspoint memory structure includes at least one memory cell in a stack between layers of BL and WL. As illustrated, WLs 215 are in between layers of elements, and BLs 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

Figure 5:
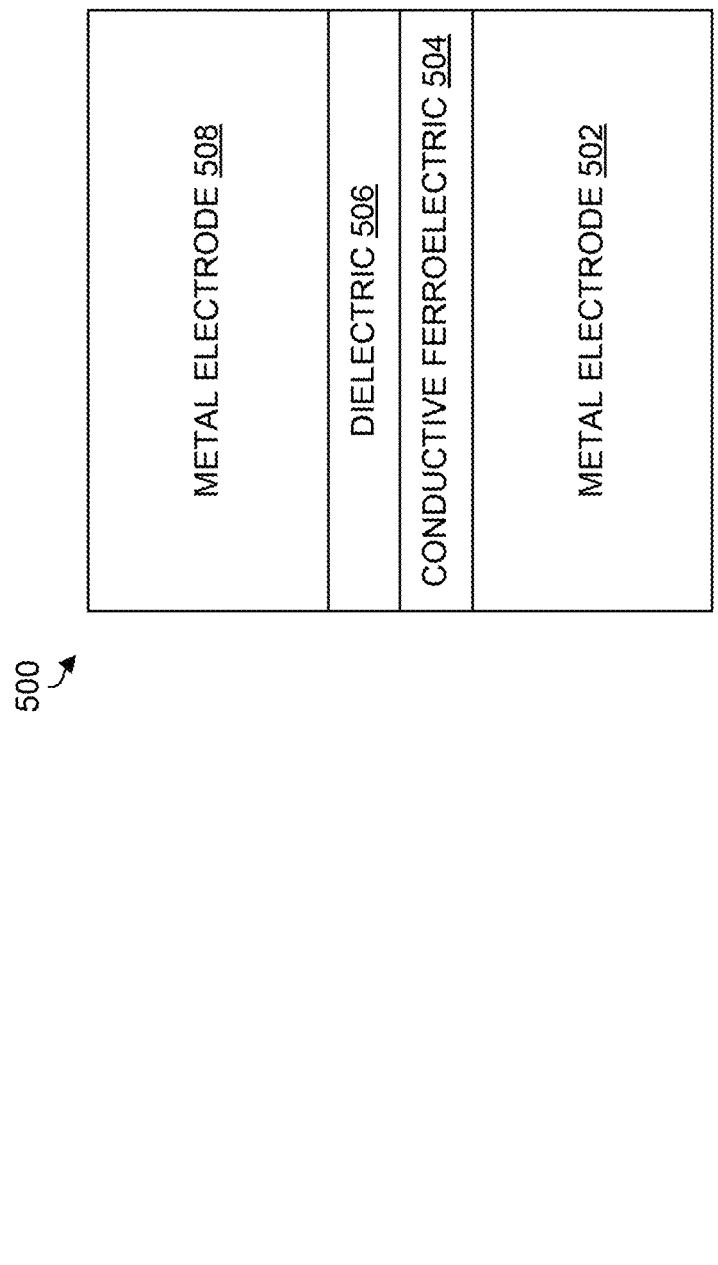
FIG. 5 illustrates a memory cell comprising a conductive ferroelectric material in series with a dielectric material in accordance with certain embodiments.

FIG. 5 illustrates a memory cell 500 comprising a conductive ferroelectric material 504 in series with a dielectric material 506 in accordance with certain embodiments. In the embodiment depicted, the conductive ferroelectric material 504 is between a bottom metal electrode 502 and dielectric material 506. The dielectric material 506 is between the conductive ferroelectric material 504 and a top metal electrode 508.

The memory cell 500 may include a conductive ferroelectric material 504. While ferroelectrics are usually insulating, some ferroelectrics (e.g., thin ferroelectrics) may exhibit conductive behavior. In various examples, the conductive ferroelectric material of the memory cell may comprise germanium tellurium (GeTe), tungsten tellurium (WTe$_2$), or other thin conductive ferroelectric material.

A dielectric material 506 may be formed in series with the conductive ferroelectric material. In an example, the dielectric material comprises an oxide, such as an oxide formed from passivation of another portion of the memory cell such as a metal electrode 508, hafnium oxide (HfOx), or other suitable oxide. In another example, the dielectric material may comprise a nitride, such as silicon nitride (SiN). Any other suitable dielectric material may be used.

In various embodiments, a thin conductive ferroelectric material 504 (e.g., GeTe) in series with a dielectric material 506 may provide minimal intermixing and good adhesion to metal electrodes at CMOS back-end temperatures.

Figure 6B:
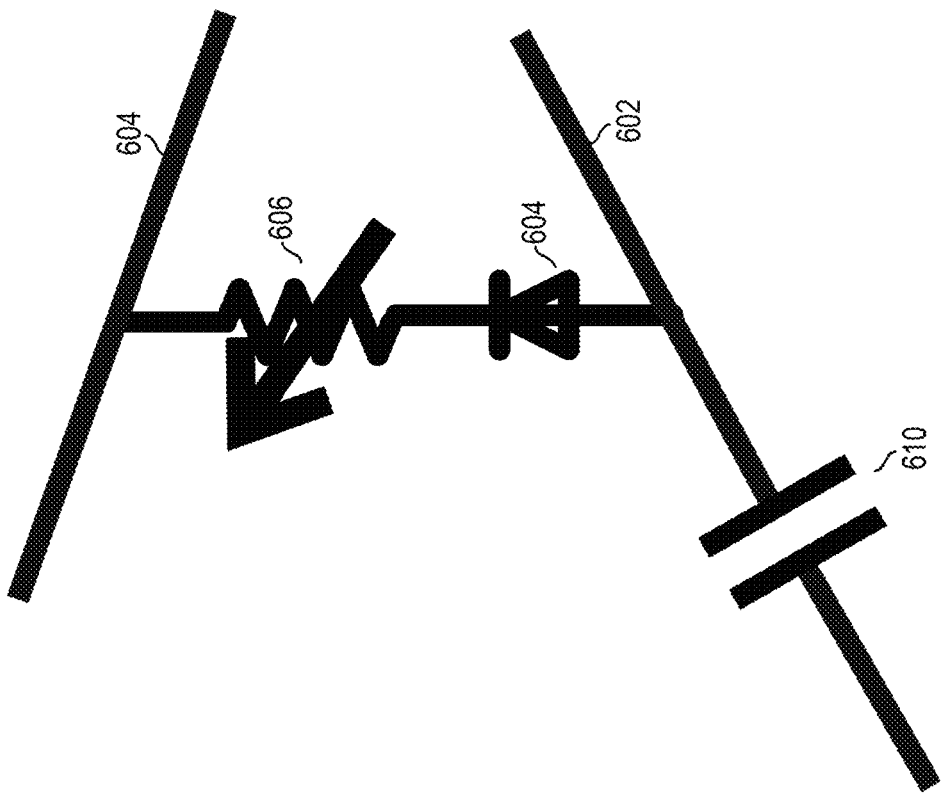
FIGS. 6A and 6B illustrate schematics of memory cells comprising a conductive ferroelectric material in series with a dielectric material comprising in accordance with certain embodiments.
Figure 6A:
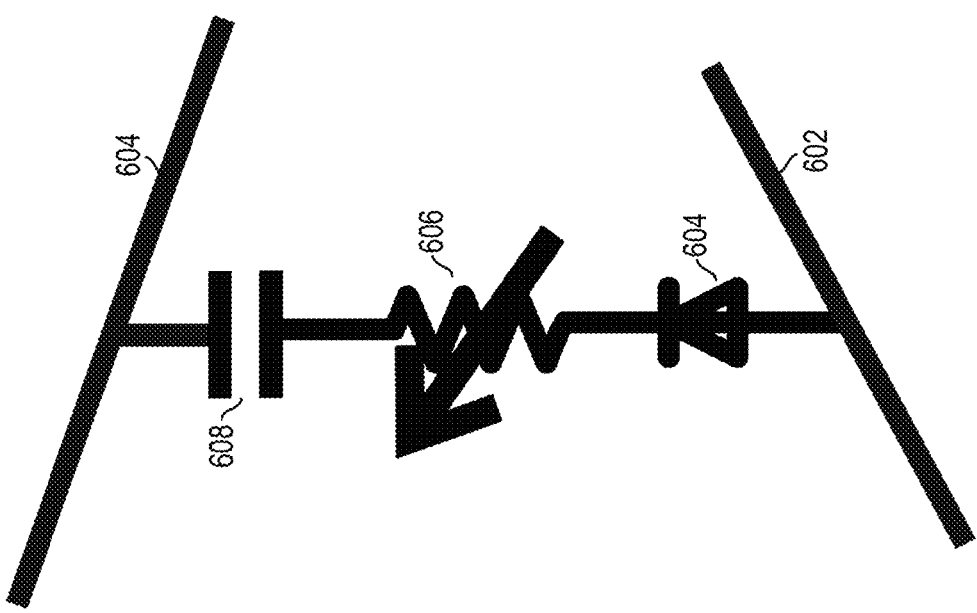

FIGS. 6A and 6B illustrate schematics of memory cells comprising a conductive ferroelectric material in series with a dielectric material comprising in accordance with certain embodiments. In FIG. 6A, a diode 604, conductive ferroelectric material 606 (shown as an element having a variable resistance), and a dielectric material 608 (introducing a capacitance to block DC current) are coupled between access lines 602 and 604 (e.g., a bitline and a wordline). In FIG. 6B, diode 604 and conductive ferroelectric material 606 are coupled between access lines 602 and 604. The dielectric material 610 in this embodiment is on the access line 610 that is coupled to the memory cell (comprising 604 and 606).

If the state of a memory cell depends on electric field type switching, then a capacitor (e.g., implemented by 608 or 610) may be in series with the storage element (e.g., 606) and selector (e.g., diode 604) in between the access lines 602 and 604 or the capacitor may be placed on the end of an access line (e.g., 602) to cause the storage element to switch states based on the electric field (rather than the current through the storage element).

A Schottky diode (e.g., one embodiment of 604) is a majority-carrier device which enables fast (e.g., nanosecond) turn-ON/OFF times for a memory cell. In one example, the diode may be any suitable thin film diode. In various embodiments, a Schottky diode may comprise a metal (e.g., tungsten or other suitable metal or alloy) and a low-leakage semiconducting oxide or other conductive oxide in series with the metal layer. In one example, the Schottky diode may comprise indium gallium zinc oxide. In one embodiment, a memory cell comprises a metal/semiconductor Schottky diode formed by deposition of a metal (e.g., tungsten) layer on a P-type Si substrate. In some embodiments, the diode 604 may be fabricated during the back-end of the memory fabrication process flow. In various examples, a negative voltage may forward bias the diode (although in other examples a positive voltage may forward bias the diode). The Schottky diode may provide a simple way to realize ON/OFF rectification in the memory cell.

Figure 7:
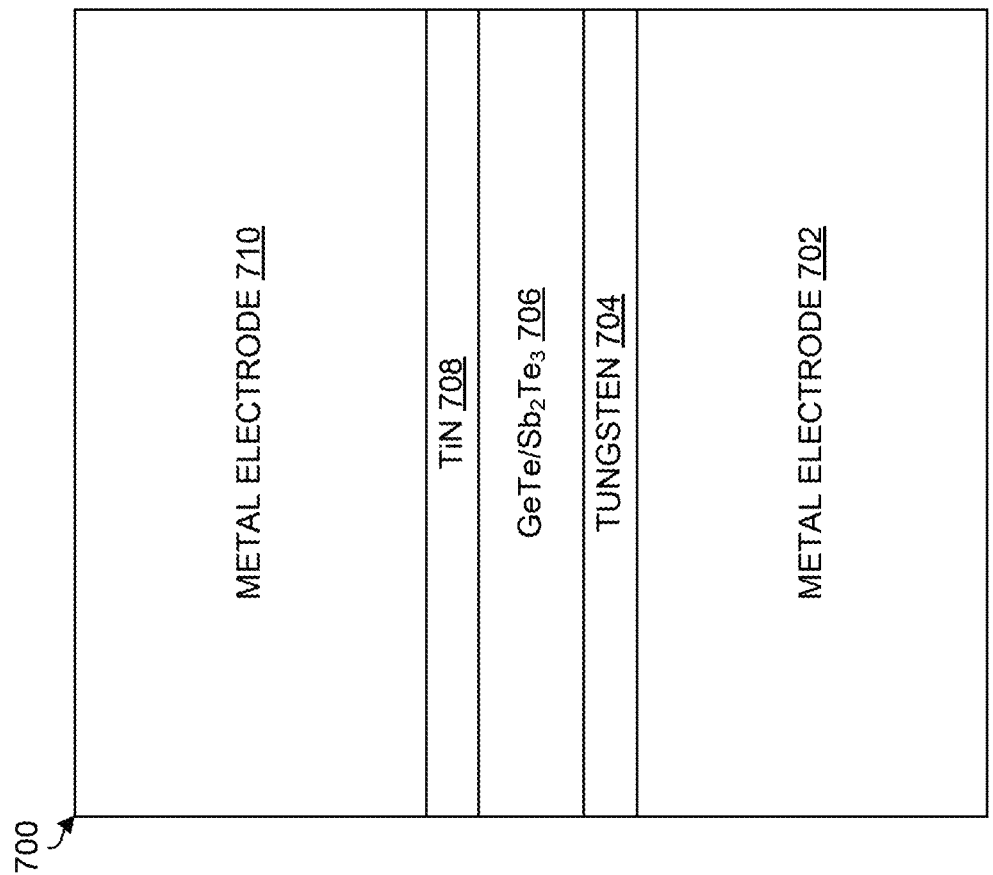
FIG. 7 illustrates an example memory cell in accordance with certain embodiments.

FIG. 7 illustrates an example memory cell 700 in accordance with certain embodiments. Memory cell 700 includes a metal electrode 702, a tungsten layer 704, a GeTe/Sb$_2$Te$_3$ stack 706 (a memory stack with alternating layers of GeTe and antimony tellurium (Sb$_2$Te$_3$)), a TiN layer 708, and a metal electrode 710. Referring to the stack 706, at least in some embodiments, there may be a Van der Waals (vdW) gap between each pair of layers. In various embodiments, the GeTe may function as a conductive ferroelectric material while the Sb$_2$Te$_3$ may provide structural support. The GeTe/Sb$_2$Te$_3$ stack 706 may be formed in any suitable manner, such as sputtering of the respective layers.

In one embodiment, TiN and tungsten may be used as a top electrode material. The TiN may alleviate adhesion problems (e.g., the metal of the electrode sticking to the stack 706) by reducing stress.

Figure 8:
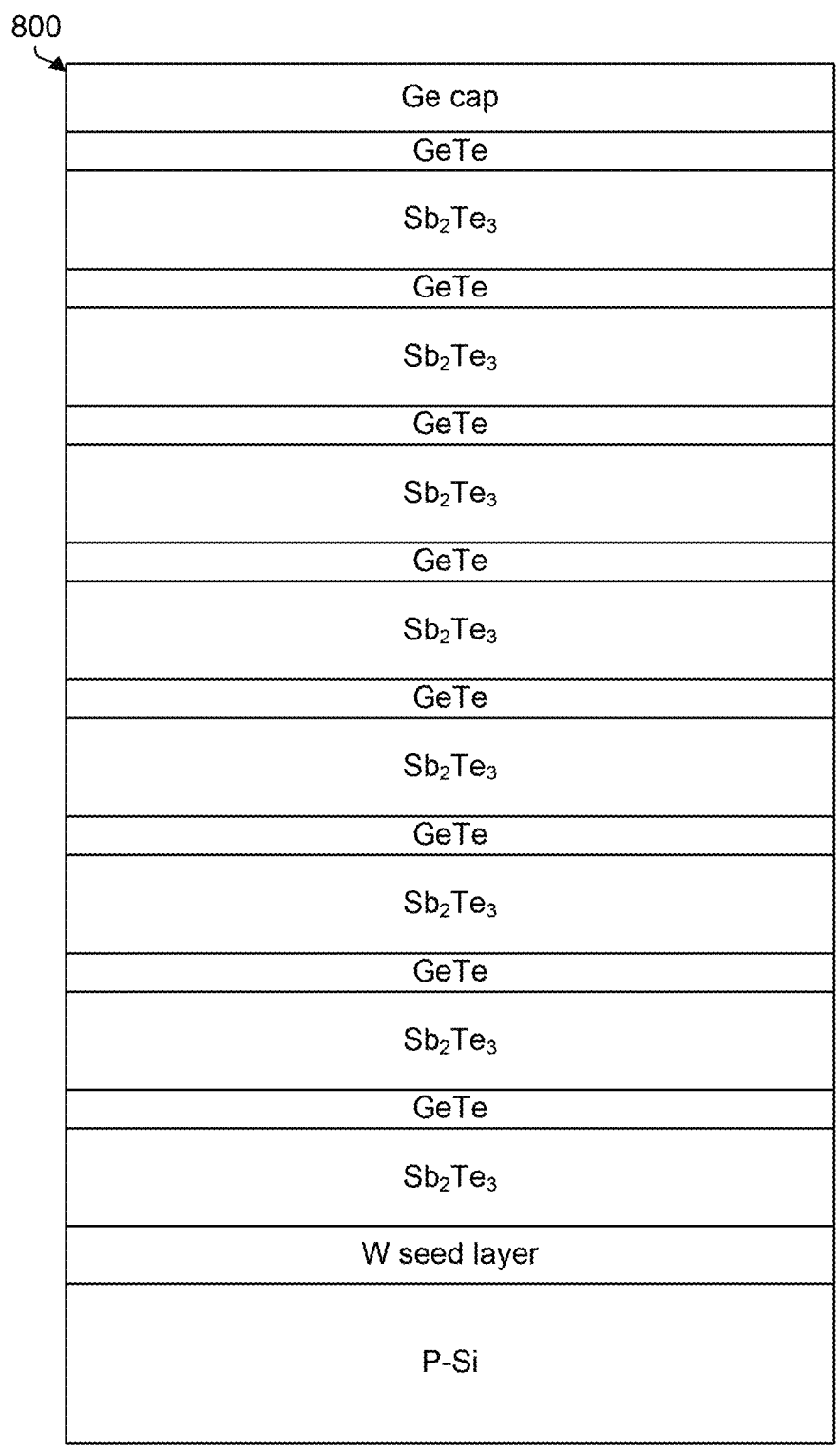
FIG. 8 illustrates an example memory cell stack in accordance with certain embodiments.

FIG. 8 illustrates an example GeTe/Sb$_2$Te$_3$ memory cell stack 800 in accordance with certain embodiments. The stack may comprise any number of alternating layers of any suitable thicknesses. In some examples, the stack may comprise between four and eight alternating layers. In one example, a GeTe layer may have a thickness of about 1 nm while a Sb$_2$Te$_3$ layer may have a thickness of between 2 and 4 nm. The stack may include a Ge cap on top of the last GeTe layer.

The tungsten (W) seed layer may promote growth of the antimony tellurium and may also function (e.g., in conjunction with a semiconducting oxide or other conductive oxide) as a Schottky diode. The formation of the stack may comprise any one or more of oxide passivation, chemical mechanical polishing, and pad metallization.

The stack 800 may exhibit a high degree of crystallinity and an extremely smooth surface, with low interdiffusion between GeTe and Sb$_2$Te$_3$ layers. The stack may comprise periodic features, which could be attributed to 1-2 monolayers of GeTe between $Sb_2Te_3$ layers and is consistent with a ferroelectric phase.

Figure 9:
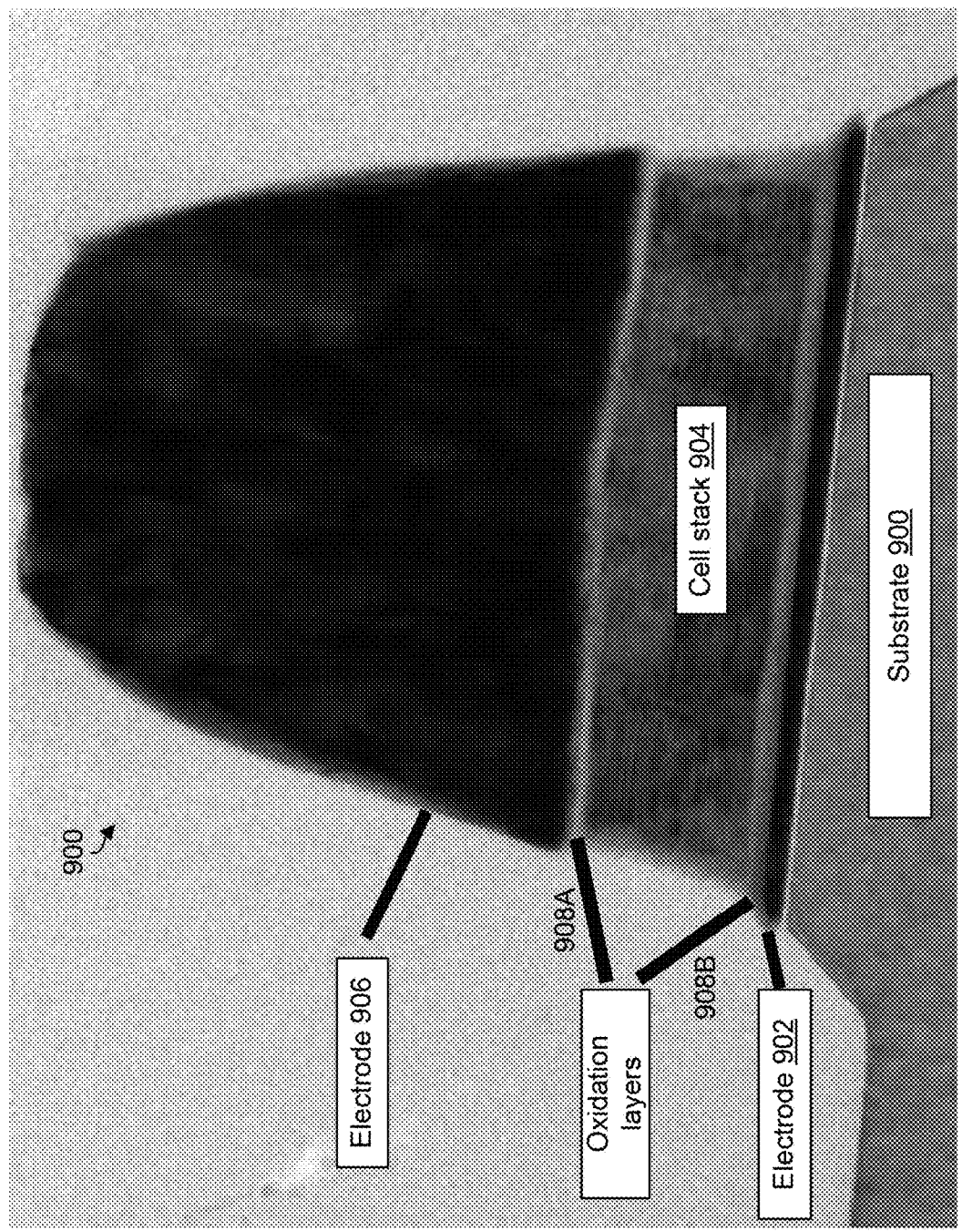
FIG. 9 illustrates an image of a memory cell in accordance with certain embodiments.

FIG. 9 depicts an image of an example memory cell 900. The memory cell is formed on a substrate 900 and includes a bottom electrode 902, a cell stack 904 (e.g., a $GeTe/Sb_2Te_3$ stack), and a top electrode 906. An oxidation layer 908A is formed between the cell stack 904 and the top electrode 906 and another oxidation layer 908B is formed between the cell stack 904 and the bottom electrode 902. The oxidation layers 908 may be formed in any suitable manner (e.g., during passivation). The write voltages required to change the state of the cell 900 may be dependent on the thickness of the oxidation layers (and relatively thin oxidation layers or other dielectric layers may reduce the write voltages for the cells).

Figure 10:
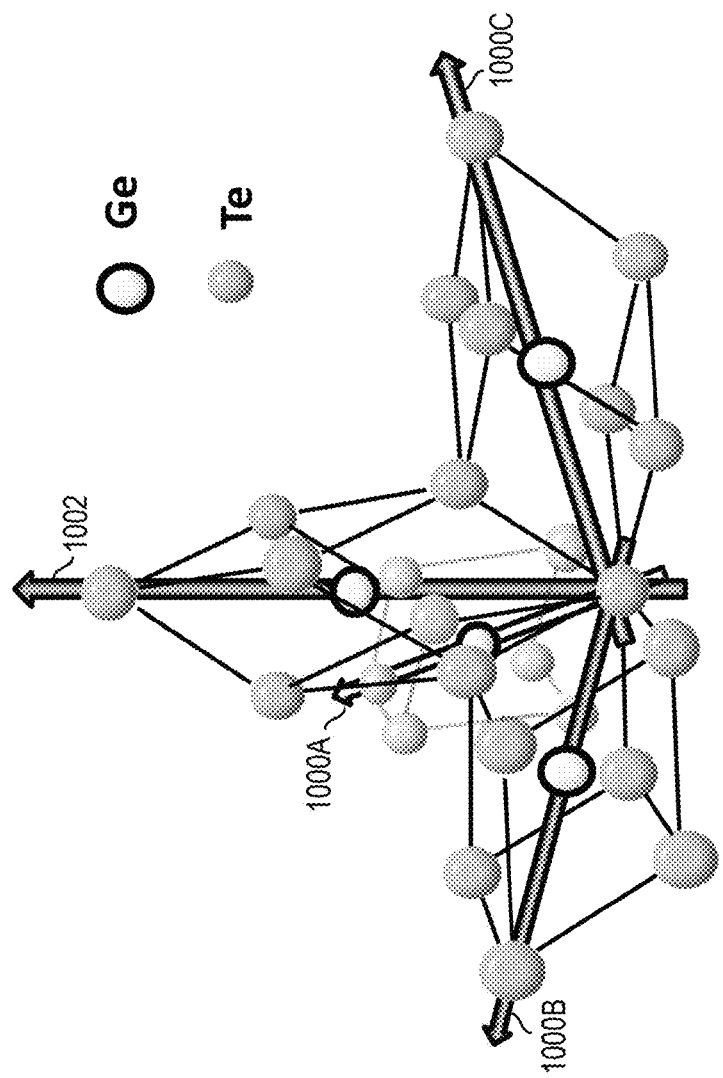
FIG. 10 illustrates polarizations of germanium tellurium (GeTe) in accordance with certain embodiments.

FIG. 10 illustrates polarizations of germanium tellurium (GeTe) in accordance with certain embodiments. Ferroelectric behavior of GeTe has been demonstrated (e.g., by piezoresponse force microscopy (PFM)). While conventional ferroelectrics are insulating, some ferroelectrics (e.g., GeTe) may be conductive. Switching of states between a high resistance state and a low resistance state in a conductive 2D ferroelectrics may be caused by electric field penetration into the ferroelectric.

As shown in FIG. 10, GeTe can be distorted along the [111] direction into a rhombohedral unit cell. GeTe is special because the direction of its dipole moment can be out-of-plane or canted, with a fourfold degeneracy. A dipole moment may include a separation of charge, such that one side of the dipole moment is more positive than the other side of the dipole moment. In the embodiment depicted, the arrows 1000 (e.g., 1000A, 1000B, 1000C) depict in-plane dipole moments (which are slightly canted), while the arrow 10002 depicts an out-of-plane dipole moment. This physical insight into its ferroelectric structure will be discussed further in connection with the transient responses of $GeTe/Sb_2Te_3$ devices to electrical pulses.

Figure 11:
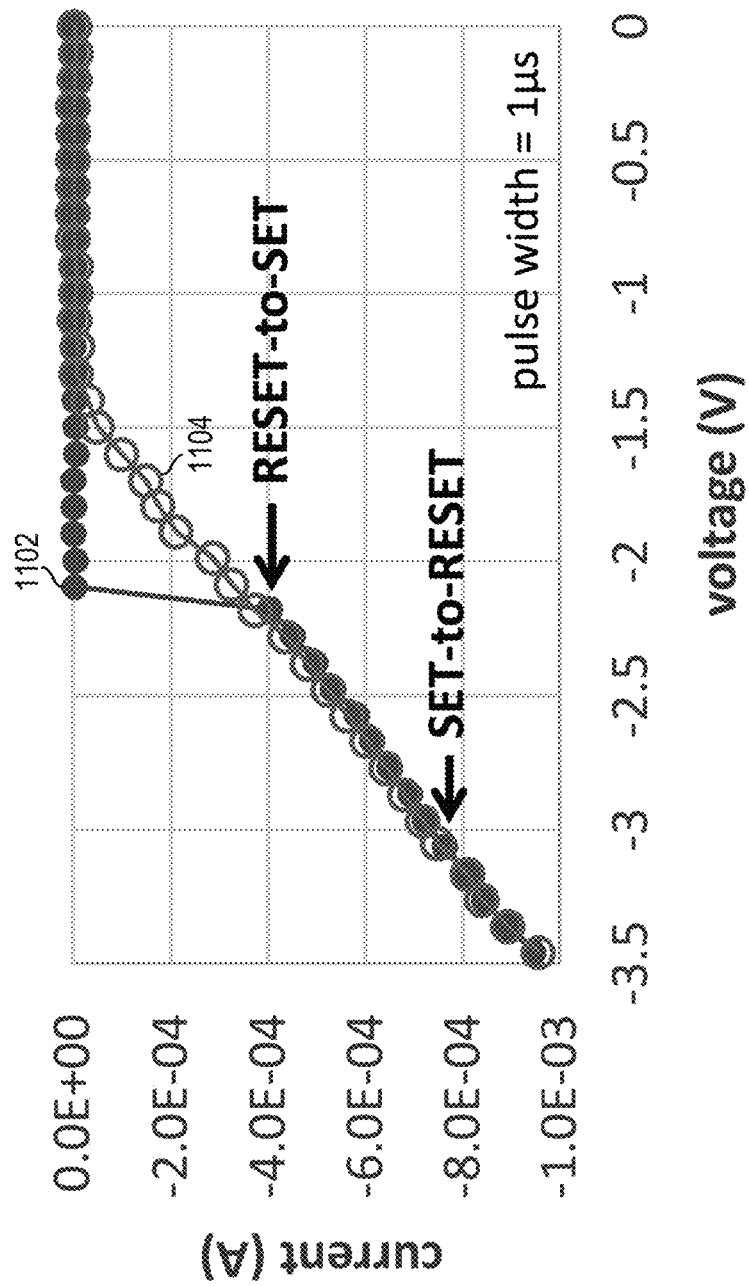
FIG. 11 illustrates I-V graphs of different memory cell states in accordance with certain embodiments.

FIG. 11 illustrates pulsed I-V sweeps (with pulse width=1us) on a memory cell comprising a $GeTe/Sb_2Te_3$ stack in series with a Schottky diode. The sweeps demonstrate switching of the memory cell between a high resistance state (RESET) and a low resistance state. The high resistance state of the memory cell are represented by points 1102 while the low resistance state of the memory cell are represented by points 1104. FIG. 11 illustrates the unipolar nature of the memory cell in which the memory cell may switch states under a single voltage polarity (at different magnitudes of the voltage and resultant current).

A RESET-to-SET state transition occurs when the GeTe dipole is aligned towards the direction of the applied electric field. A SET-to-RESET state transition occurs, in a unipolar fashion, when the depolarization field becomes strong enough to flip the dipole direction. This flip may occur at the falling edge of a sufficiently high amplitude RESET voltage pulse when the internal field experienced by GeTe comes from a strong depolarization. Even if the pulse fall time was skewed (e.g., from 100 ns to 1 us), a full RESET is still achievable and the pulsed I-Vs may remain unchanged. This indicates that the switching mechanism is not the standard melt/quench process observed in conventional phase change materials (e.g., $Ge_2Sb_2Te_5$). Similar switching may be shown for positive pulse voltages, but may require larger voltages, e.g., in order for the Schottky diode to start conducting under reverse-bias breakdown.

A read operation on the memory cell may be a field driven event, where a critical threshold value applied to the memory cell may enable logic to determine whether the memory cell is in the SET or RESET state based on the resultant current.

Figure 12:
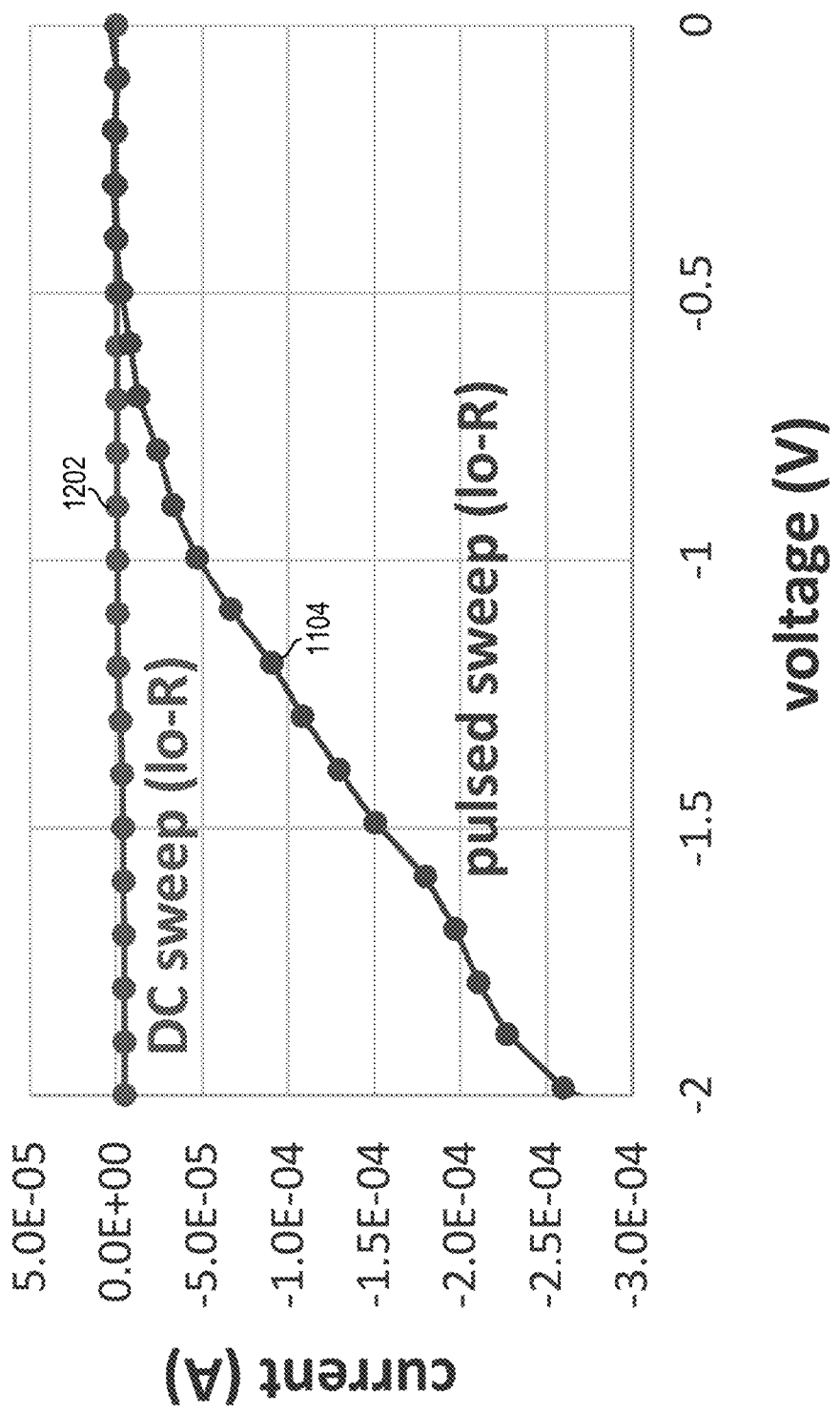
FIG. 12 illustrates I-V graphs of a pulsed sweep and a DC sweep in accordance with certain embodiments.

FIG. 12 includes the current plot 1104 of the low resistance state (lo-R) of FIG. 11 as well as the current plot of a DC voltage sweep for the same memory cell. The DC and pulsed I-Vs show very different amounts of current flow. This is due to the DC blocking nature of the memory cell, which is caused by one or more dielectrics in series with the conductive ferroelectric material. For example, one or both of the oxidation layers 908 shown in FIG. 9 (or an oxidation layer or other dielectric that could be formed in one of the other memory cells described herein) may block the DC component of the current flow.

One may posit that because of the oxidation, the switching in the memory stacks is caused by resistive random-access memory (RRAM)-filaments. Unipolar RRAM switching from SET-to-RESET may be clearly observed in an I-V sweep because of filament rupture. However, electrical measurements of a stack (e.g., of FIG. 9) do not show evidence of this transition in the pulsed I-V curves, even after extending the pulsed voltage on SET bits beyond −3.5V. Thus, the oxidation is not inducing RRAM behavior (e.g., conductive filaments breaking and forming), but rather is related to GeTe and its ferroelectric behavior.

Transient measurements also support the conclusion that the current response is consistent with behavior expected from a ferroelectric stack. In at least some embodiments, for a long (e.g., >ms) pulse, the current transient decays to DC steady-state values. Shorter pulses may result in higher current in the first rising edge (which may be attributed to the GeTe dipole switching out-of-plane and aligning with the applied electric field). Successive pulses do not show the same response at the rising edges since the GeTe dipole remains out-of-plane. However, when the off-time between pulses increases (which allows more time for the out-of-plane dipole to relax back to its original canted direction when the pulse voltage returns to zero), the higher current in the rising edge is present for each subsequent pulse. The relaxation of the dipole may occur without reversing the dipole direction because of the smaller depolarization fields experienced by a smaller READ voltage.

If the read pulse width is short enough, the dipole change manifests as the same current magnitude for consecutive read events. In other words, multiple reads of the same memory cell can be achieved without disturbing the state of the cell. It takes time for the dipole to be pulled out-of-plane because of the competing effects of applied voltage (which favors dipole movement out-of-plane) and depolarization (which favors dipole movement back in-plane) while reading a lo-R device with smaller voltages. As time elapses during the pulse, the dipole reaches a steady-state position where its polarization no longer changes, and displacement current flow stops.

Figure 13:
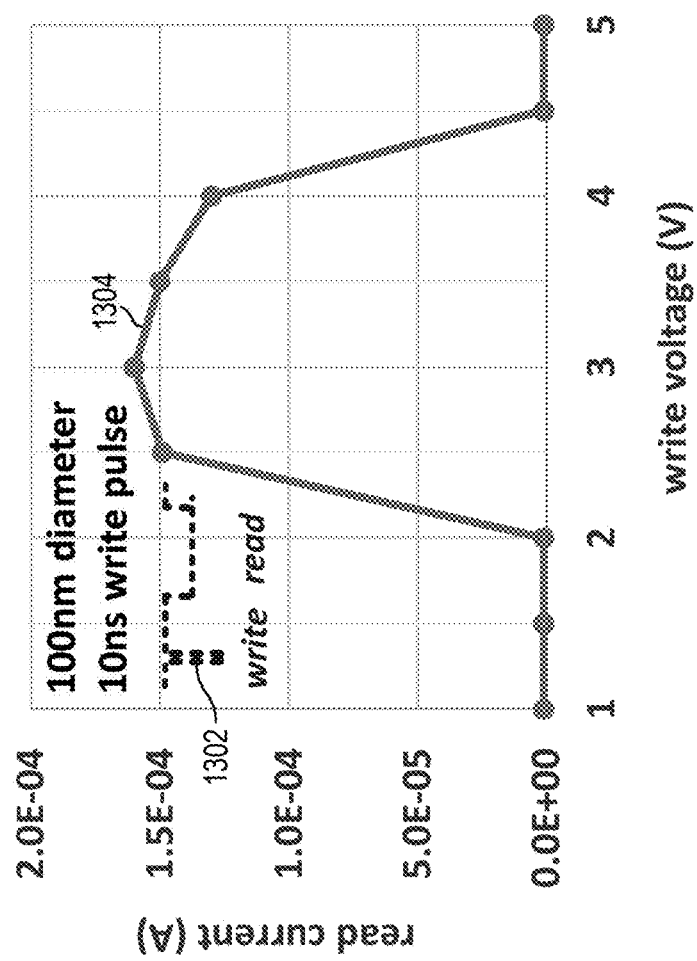
FIG. 13 illustrates an I-V graph of a memory cell in accordance with certain embodiments.

FIG. 13 illustrates an example graph depicting switching in a high resistance versus a low resistance state. A write pulse (e.g., with length of 10 ns) is applied followed by application of a read pulse (e.g., with length of 100 ns). As the voltage of the write pulse is increased, the memory cell (e.g., that shown in FIG. 9) switches from high resistance to low resistance, so more current flows through the cell. If additional current is applied by raising the write voltage, the memory cell goes back to a high resistance state and little current flows through it. In other embodiments, the voltages and/or currents may differ depending on the geometries and materials of the memory device. As shown, switching may occur in the memory cell with voltage pulses of relatively short length (e.g., 10 ns).

The flows described in the FIGs. are merely representative of operations that may occur in particular embodiments. Some of the operations illustrated in the FIGs. may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory partition controller 210, wordline control logic 214, bitline control logic 216, WL switch circuitry 220, BL switch circuitry 224, access circuitry 342, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g. reset, while an updated value potentially includes a low logical value, e.g. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (e.g., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Example 1 includes a memory device including a three dimensional crosspoint memory array comprising a plurality of memory cells, wherein a memory cell of the plurality of memory cells comprises a conductive ferroelectric material and wherein the conductive ferroelectric material is in series with a dielectric material.

Example 2 includes the subject matter of Example 1, and wherein the dielectric material is between the conductive ferroelectric and an access line coupled to the conductive ferroelectric material.

Example 3 includes the subject matter of any of Examples 1 and 2, and wherein the dielectric material is on an access line coupled to the conductive ferroelectric material.

Example 4 includes the subject matter of any of Examples 1-3, and wherein the conductive ferroelectric material is in series with a second dielectric material.

Example 5 includes the subject matter of any of Examples 1-4, and wherein the dielectric material comprises an oxide.

Example 6 includes the subject matter of any of Examples 1-5, and wherein the dielectric material comprises a nitride.

Example 7 includes the subject matter of any of Examples 1-6, and wherein the conductive ferroelectric material comprises germanium tellurium (GeTe).

Example 8 includes the subject matter of any of Examples 1-7, and wherein the conductive ferroelectric material comprises tungsten tellurium (WTe2).

Example 9 includes the subject matter of any of Examples 1-8, and wherein the conductive ferroelectric material comprises a plurality of alternating layers of germanium tellurium (GeTe) and antimony tellurium (Sb2Te3).

Example 10 includes the subject matter of any of Examples 1-9, and further including circuitry to provide unipolar pulses to set the conductive ferroelectric material to a low resistance state, reset the conductive ferroelectric material to a high resistance state, and to read the state of the conductive ferroelectric material.

Example 11 includes the subject matter of any of Examples 1-10, and further including a Schottky diode between an access line and the conductive ferroelectric material.

Example 12 includes the subject matter of any of Examples 1-11, and further including a plurality of memory chips, wherein a first memory chip comprises the three dimensional crosspoint memory array.

Example 13 includes the subject matter of any of Examples 1-12, and further including a memory controller to communicate with the plurality of memory chips.

Example 14 includes the subject matter of any of Examples 1-13, and wherein the memory device comprises a solid state drive.

Example 15 includes the subject matter of any of Examples 1-14, and wherein the memory device comprises a dual in-line memory module.

Example 16 includes a method comprising forming a three dimensional crosspoint memory array comprising a plurality of memory cells, wherein a memory cell of the plurality of memory cells comprises a conductive ferroelectric material and wherein the conductive ferroelectric material is in series with a dielectric material.

Example 17 includes the subject matter of Example 16, and further including forming the dielectric material between the conductive ferroelectric and an access line to be coupled to the conductive ferroelectric material.

Example 18 includes the subject matter of any of Examples 16 and 17, and further including forming the dielectric material on an access line to be coupled to the conductive ferroelectric material.

Example 19 includes the subject matter of any of Examples 16-18, and further including forming a second dielectric material in series with the conductive ferroelectric material.

Example 20 includes the subject matter of any of Examples 16-19, and wherein the dielectric material comprises an oxide.

Example 21 includes the subject matter of any of Examples 16-20, and wherein the dielectric material comprises a nitride.

Example 22 includes the subject matter of any of Examples 16-21, and wherein the conductive ferroelectric material comprises germanium tellurium (GeTe).

Example 23 includes the subject matter of any of Examples 16-22, and wherein the conductive ferroelectric material comprises tungsten tellurium (WTe2).

Example 24 includes the subject matter of any of Examples 16-23, and wherein the conductive ferroelectric material comprises a plurality of alternating layers of germanium tellurium (GeTe) and antimony tellurium (Sb2Te3).

Example 25 includes the subject matter of any of Examples 16-24, and further including forming circuitry to provide unipolar pulses to set the conductive ferroelectric material to a low resistance state, reset the conductive ferroelectric material to a high resistance state, and to read the state of the conductive ferroelectric material.

Example 26 includes the subject matter of any of Examples 16-25, and further including forming a Schottky diode between an access line and the conductive ferroelectric material.

Example 27 includes a system comprising a storage device controller; and at least one memory chip coupled to the storage device controller, wherein a memory chip comprises a three dimensional crosspoint memory array comprising a plurality of memory cells, wherein a memory cell of the plurality of memory cells comprises a conductive ferroelectric material and wherein the conductive ferroelectric material is in series with a dielectric material.

Example 28 includes the subject matter of Example 27, and further including a processor to execute an instruction requesting a memory access and to send a request for the memory access to the storage device controller.

Example 29 includes the subject matter of any of Examples 27 and 28, and further including one or more of a battery communicatively coupled to the processor, a display communicatively coupled to the processor, or a network interface communicatively coupled to the processor.

Example 30 includes the subject matter of any of Examples 27-29, and wherein the dielectric material is between the conductive ferroelectric and an access line coupled to the conductive ferroelectric material.

Example 31 includes the subject matter of any of Examples 27-30, and wherein the dielectric material is on an access line coupled to the conductive ferroelectric material.

Example 32 includes the subject matter of any of Examples 27-31, and wherein the conductive ferroelectric material is in series with a second dielectric material.

Example 33 includes the subject matter of any of Examples 27-32, and wherein the dielectric material comprises an oxide.

Example 34 includes the subject matter of any of Examples 27-33, and wherein the dielectric material comprises a nitride.

Example 35 includes the subject matter of any of Examples 27-34, and wherein the conductive ferroelectric material comprises germanium tellurium (GeTe).

Example 36 includes the subject matter of any of Examples 27-35, and wherein the conductive ferroelectric material comprises tungsten tellurium (WTe2).

Example 37 includes the subject matter of any of Examples 27-36, and wherein the conductive ferroelectric material comprises a plurality of alternating layers of germanium tellurium (GeTe) and antimony tellurium (Sb2Te3).

Example 38 includes the subject matter of any of Examples 27-37, and further including circuitry to provide unipolar pulses to set the conductive ferroelectric material to a low resistance state, reset the conductive ferroelectric material to a high resistance state, and to read the state of the conductive ferroelectric material.

Example 39 includes the subject matter of any of Examples 27-38, and further including a Schottky diode between an access line and the conductive ferroelectric material.

Example 40 includes the subject matter of any of Examples 27-39, and further including a plurality of memory chips, wherein a first memory chip comprises the three dimensional crosspoint memory array.

Example 41 includes the subject matter of any of Examples 27-40, and further including a memory controller to communicate with the plurality of memory chips.

In the foregoing specification, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A memory device including:
   a three dimensional crosspoint memory array comprising a plurality of memory cells, wherein a memory cell of the plurality of memory cells comprises a conductive ferroelectric material and wherein the conductive ferroelectric material is in series with a dielectric material and a tungsten layer; and a Schottky diode between an access line and the conductive ferroelectric material, wherein the Schottky diode comprises the tungsten layer.

2. The memory device of claim 1, wherein the conductive ferroelectric material comprises a plurality of alternating layers of germanium tellurium (GeTe) and antimony tellurium ($Sb_2Te_3$).

3. The memory device of claim 2, wherein the conductive ferroelectric material comprises a germanium cap on top of a last GeTe layer of the plurality of alternating layers.

4. The memory device of claim 2, wherein a GeTe layer in between a pair of $Sb_2Te_3$ layers is between one and two monolayers thick.

5. The memory device of claim 2, wherein a layer of $Sb_2Te_3$ of the plurality of alternating layers is between two and four nanometers thick.

6. The memory device of claim 2, wherein the conductive ferroelectric material is in contact with a titanium nitride layer, the titanium nitride layer in contact with an electrode of the memory cell.

7. The memory device of claim 1, wherein the dielectric material comprises hafnium oxide.

8. The memory device of claim 1, wherein the conductive ferroelectric material comprises tungsten tellurium ($WTe_2$).

9. The memory device of claim 1, further comprising circuitry to provide unipolar pulses of different magnitudes of a negative polarity to set the conductive ferroelectric material to a low resistance state, reset the conductive ferroelectric material to a high resistance state, and to read the state of the conductive ferroelectric material.

10. The memory device of claim 1, further comprising a plurality of memory chips, wherein a first memory chip comprises the three dimensional crosspoint memory array.

11. The memory device of claim 10, further comprising a memory controller to communicate with the plurality of memory chips.

12. The memory device of claim 1, wherein the memory device comprises a solid state drive.

13. The memory device of claim 1, wherein the memory device comprises a dual in-line memory module.

14. The memory device of claim 1, wherein the Schottky diode between the access line and the conductive ferroelectric material further comprises indium gallium zinc oxide.

15. A method comprising:
forming a three dimensional crosspoint memory array comprising a plurality of memory cells, wherein a memory cell of the plurality of memory cells comprises a conductive ferroelectric material and wherein the conductive ferroelectric material is in series with a dielectric material and a tungsten layer; and
forming a Schottky diode between an access line and the conductive ferroelectric material, wherein the Schottky diode comprises the tungsten layer.

16. The method of claim 15, further comprising forming the dielectric material between the conductive ferroelectric material and an access line to be coupled to the conductive ferroelectric material.

17. The method of claim 15, further comprising forming the dielectric material on an access line to be coupled to the conductive ferroelectric material.

18. A system comprising:
a storage device controller; and
at least one memory chip coupled to the storage device controller, wherein a memory chip comprises:
a three dimensional crosspoint memory array comprising a plurality of memory cells, wherein a memory cell of the plurality of memory cells comprises a conductive ferroelectric material and wherein the conductive ferroelectric material is in series with a dielectric material and a tungsten layer, wherein the conductive ferroelectric material comprises a plurality of alternating layers of germanium tellurium (GeTe) and antimony tellurium ($Sb_2Te_3$) wherein the conductive ferroelectric material comprises a germanium cap on top of a last GeTe layer of the plurality of alternating layers.

19. The system of claim 18, further comprising a processor to execute an instruction requesting a memory access and to send a request for the memory access to the storage device controller.

20. The system of claim 19, further comprising one or more of: a battery communicatively coupled to the processor, a display communicatively coupled to the processor, or a network interface communicatively coupled to the processor.

* * * * *